US012772821B2

(12) United States Patent
Narasimha et al.

(10) Patent No.: US 12,772,821 B2
(45) Date of Patent: Oct. 20, 2026

(54) MEMORY CELL STRUCTURES USING FULL BACKSIDE CONNECTIVITY

(71) Applicant: QUALCOMM Incorporated, San Diego, CA (US)

(72) Inventors: Shreesh Narasimha, Charlotte, NC (US); Yan Sun, San Diego, CA (US); Yandong Gao, San Diego, CA (US); Peijie Feng, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 394 days.

(21) Appl. No.: 18/469,501

(22) Filed: Sep. 18, 2023

(65) Prior Publication Data

US 2025/0096075 A1 Mar. 20, 2025

(51) Int. Cl.

*H10W 20/20* (2026.01)
*H10B 10/00* (2023.01)
*H10D 30/67* (2025.01)
*H10D 62/10* (2025.01)

(52) U.S. Cl.

CPC .......... *H10W 20/20* (2026.01); *H10B 10/125* (2023.02); *H10D 30/6729* (2025.01); *H10D 30/6735* (2025.01); *H10D 30/6757* (2025.01); *H10D 62/121* (2025.01)

(58) Field of Classification Search

CPC ............. H01L 23/481; H01L 21/76895; H01L 23/5286; H10B 10/125; H10D 30/6729; H10D 30/6735; H10D 30/6757; H10D 62/121; H10D 30/019; H10D 30/501; H10D 64/017; H10D 64/518; H10D 89/10; B82Y 10/00

See application file for complete search history.

(56) References Cited

U.S. PATENT DOCUMENTS

| | | | |
|---|---|---|---|
| 9,887,269 B2 | 2/2018 | Ching et al. | |
| 10,879,375 B2 | 12/2020 | Fan et al. | |
| 11,437,379 B2 | 9/2022 | Song | |
| 11,450,665 B2 | 9/2022 | Chiang et al. | |
| 11,616,015 B2 | 3/2023 | Morrow et al. | |
| 2015/0262984 A1* | 9/2015 | Krabe ............... | H01L 21/76877 438/107 |

(Continued)

OTHER PUBLICATIONS

International Search Report and Written Opinion—PCT/US2024/046898—ISA/EPO—Jan. 14, 2025.

*Primary Examiner* — Teresa M. Arroyo
(74) *Attorney, Agent, or Firm* — Gerald P. Joyce, III

(57) ABSTRACT

In an aspect, a semiconductor memory cell comprises gate structures separated by source or drain (S/D) structures, a frontside (FS) inter-layer dielectric (FS-ILD) layer above the gate and S/D structures, FS metal zero (FM0) interconnects above the FS-ILD layer, a backside (BS) inter-layer dielectric (BS-ILD) layer below the gate and S/D structures, BS metal zero (BM0) interconnects below the BS-ILD layer, at least one FS S/D contact (FSDC) electrically connecting an FM0 interconnect to a top surface of an S/D structure, and at least one BS S/D contact (BSDC) electrically connecting a BM0 interconnect to a bottom surface of an S/D structure. The semiconductor memory cell comprises NFETs and PFETs to form a cross-coupled inverter pair. For each inverter in the pair, one of VDD and VSS are provided by an FSDC and the other of VDD and VSS is provided by a BSDC.

18 Claims, 16 Drawing Sheets

(56) References Cited

U.S. PATENT DOCUMENTS

| | | | | |
|---|---|---|---|---|
| 2021/0375883 | A1 | 12/2021 | Hsu et al. | |
| 2021/0407996 | A1 | 12/2021 | Agrawal et al. | |
| 2022/0238725 | A1 | 7/2022 | Chiang et al. | |
| 2022/0262791 | A1 | 8/2022 | Shi et al. | |
| 2022/0319978 | A1* | 10/2022 | Bohr | H10D 62/115 |
| 2022/0352179 | A1* | 11/2022 | Yang | H10B 10/12 |
| 2023/0012680 | A1 | 1/2023 | Liaw | |
| 2023/0015572 | A1 | 1/2023 | Khaderbad et al. | |
| 2023/0058558 | A1 | 2/2023 | Bomberger et al. | |
| 2023/0067311 | A1 | 3/2023 | Lai et al. | |
| 2023/0068280 | A1 | 3/2023 | Lin et al. | |
| 2023/0086033 | A1 | 3/2023 | Xie et al. | |
| 2023/0187003 | A1 | 6/2023 | Horch | |

* cited by examiner

MEMORY CELL STRUCTURES USING FULL BACKSIDE CONNECTIVITY

BACKGROUND OF THE DISCLOSURE

1. Field of the Disclosure

This disclosure relates generally to semiconductor wafer process, and more specifically to compact logic cells using full backside connectivity and methods for making the same.

2. Description of the Related Art

Integrated circuit (IC) technology has achieved great strides in advancing computing power through miniaturization of electrical components. An IC device may be implemented in the form of an IC chip that has a set of circuits integrated thereon, including a plurality of active and passive components (e.g., transistors, diodes, capacitors, inductors, and/or resistors) and layers of contacts and interconnects above the active and passive components. In some aspects, the contacts and interconnects of an IC device are formed on the active and passive components on the front side of the IC device. As the sizes of the IC devices and the sizes of the components formed thereon become smaller, the available area for forming the contacts and interconnects also become smaller. As such, the routing complexity and/or of parasitic resistance and capacitance of the contacts and interconnects may increase and thus the manufacturing cost or the performance of the IC device may be negatively impacted.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a semiconductor device comprises a memory cell, comprising: a plurality of gate structures extending in a first direction and spaced apart from each other in a second direction by one of a first plurality of source/drain (S/D) structures, each gate structure comprising a channel structure and a metal gate structure, the channel structure comprising at least one channel extending in the second direction through the metal gate structure and connecting adjacent S/D structures in the first plurality of S/D structures to each other; a frontside inter-layer dielectric (FS-ILD) layer disposed on the plurality of gate structures and the first plurality of S/D structures; a frontside metal zero (FM0) interconnect layer, disposed on the FS-ILD layer, comprising a plurality of FM0 interconnects extending in the second direction and spaced apart from each other in the first direction; a backside inter-layer dielectric (BS-ILD) layer disposed on the plurality of gate structures and the first plurality of S/D structures; a backside metal zero (BM0) interconnect layer, disposed on the BS-ILD layer, comprising a plurality of BM0 interconnects extending in the second direction and spaced apart from each other in the first direction; a plurality of frontside source/drain contacts (FSDCs), each FSDC electrically connecting one of the plurality of FM0 interconnects to a top surface of at least one of the first plurality of S/D structures; and a plurality of backside source/drain contacts (BSDCs), each BSDC electrically connecting one of the plurality of BM0 interconnects to a bottom surface of at least one of the first plurality of S/D structures, wherein the memory cell comprises a plurality of n-type field effect transistors (NFETs) and a plurality of p-type field effect transistors (PFETs) to form a cross-coupled inverter pair comprising a first inverter and a second inverter, and wherein for each of the first inverter and the second inverter, at least one of VDD or VSS is provided by one of the plurality of FSDCs and the other of VDD or VSS is provided by one of the plurality of BSDCs.

In an aspect, a semiconductor device comprises a memory cell, comprising: a plurality of gate structures extending in a first direction and spaced apart from each other in a second direction by one of a first plurality of S/D structures, each gate structure comprising a channel structure and a metal gate structure, the channel structure comprising at least one channel extending in the second direction through the metal gate structure and connecting adjacent S/D structures in the first plurality of S/D structures to each other; an FS-ILD layer disposed on the plurality of gate structures and the first plurality of S/D structures; an FM0 interconnect layer, disposed on the FS-ILD layer, comprising a plurality of parallel FM0 interconnects extending in the second direction and spaced apart from each other in the first direction; a BS-ILD layer disposed on the plurality of gate structures and the first plurality of S/D structures; a BM0 interconnect layer, disposed on the BS-ILD layer, comprising a plurality of parallel BM0 interconnects extending in the second direction and spaced apart from each other in the first direction; a plurality of FSDCs, each FSDC electrically connecting one of the plurality of FM0 interconnects to a top surface of at least one of the first plurality of S/D structures; a plurality of BSDCs, each BSDC electrically connecting one of the plurality of BM0 interconnects to a bottom surface of at least one of the first plurality of S/D structures; and a plurality of bitlines, wherein at least one of the plurality of bitlines comprises one of the plurality of BM0 interconnects, and wherein the memory cell comprises a plurality of NFETs and a plurality of PFETs to form a cross-coupled inverter pair comprising a first inverter and a second inverter.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings, wherein like reference numbers represent like parts, which are presented solely for illustration and not limitation of the disclosure.

Figure 1A:
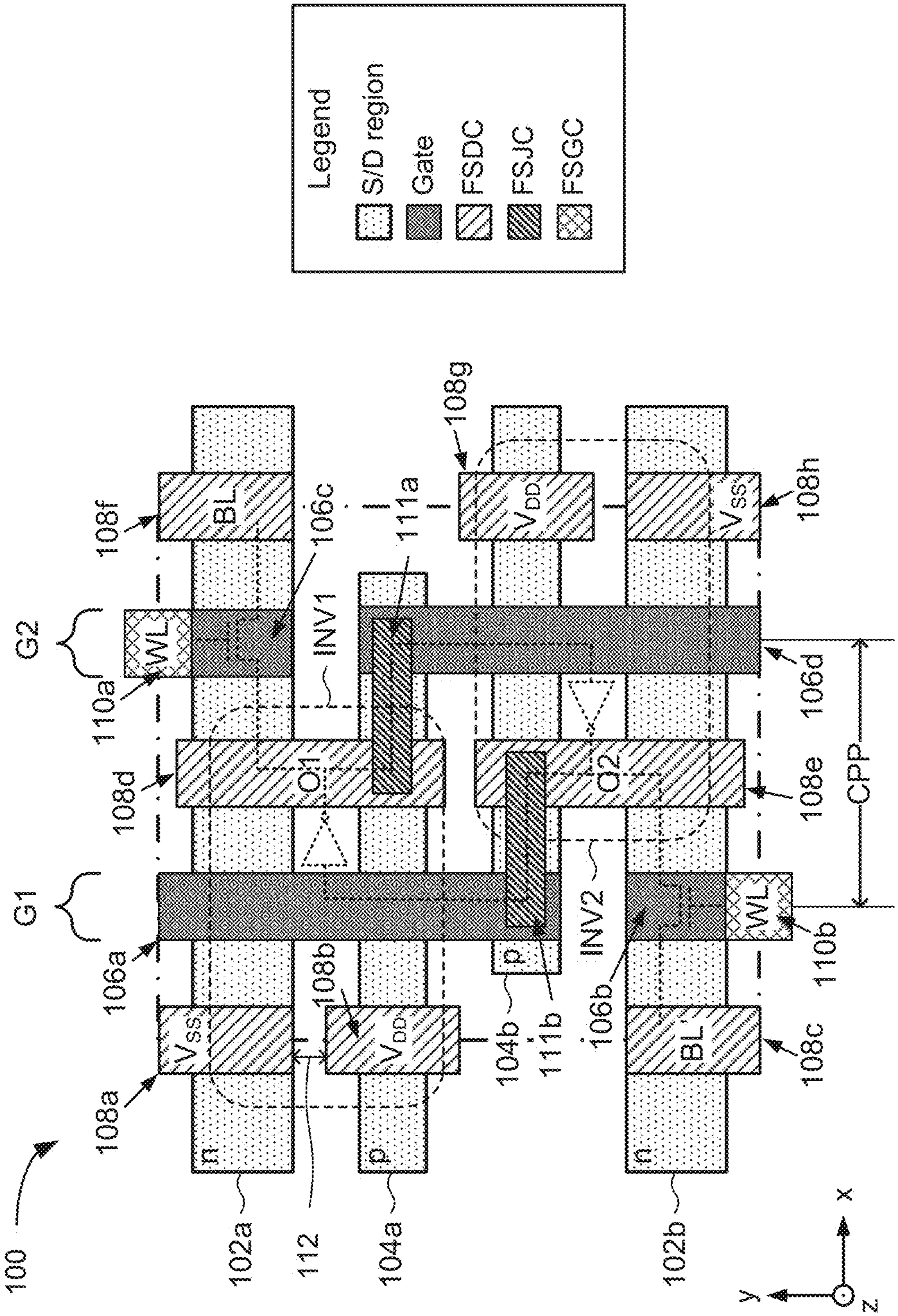
FIG. 1A and FIG. 1B are top views of a portion of a semiconductor structure of a conventional static random access memory (SRAM).

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

In an aspect, a semiconductor memory cell comprises gate structures separated by source or drain (S/D) structures, a frontside (FS) inter-layer dielectric (FS-ILD) layer above the gate and S/D structures, FS metal zero (FM0) interconnects above the FS-ILD layer, a backside (BS) inter-layer dielectric (BS-ILD) layer below the gate and S/D structures, BS metal zero (BM0) interconnects below the BS-ILD layer, at least one FS S/D contact (FSDC) electrically connecting an FM0 interconnect to a top surface of an S/D structure, and at least one BS S/D contact (BSDCs) electrically connecting a BMO interconnect to a bottom surface of an S/D structure. The gate structures comprise NFETs and PFETs to form a cross-coupled inverter pair. For each inverter in the pair, one of VDD and VSS are provided by an FSDC and the other of VDD and VSS is provided by a BSDC.

Aspects of the disclosure are provided in the following description and related drawings directed to various examples provided for illustration purposes. Alternate aspects may be devised without departing from the scope of the disclosure. Additionally, well-known elements of the disclosure will not be described in detail or will be omitted so as not to obscure the relevant details of the disclosure.

Various aspects relate generally to an integrated circuit device and a manufacturing method of making the integrated circuit device. Some aspects more specifically relate to compact memory cells using full backside connectivity to reduce cell area, reduce bitline resistance, reduce bitline capacitance, or combinations thereof.

Particular aspects of the subject matter described in this disclosure can be implemented to realize one or more of the following potential advantages. The use of backside connections allow placement of S/D contacts on either the frontside or backside of a circuit, thus avoiding S/D contact spacing violations and allowing a memory cell to be more compact. The use of backside connections enable bitline strapping using both frontside and backside M0 conductors, which lowers bitline resistance and frees higher-level metal resources for other uses. Moving the bitlines from the frontside to the backside reduces the gate-to-contact capacitance and the bitline-to-VDD capacitance. Moving VDD or VSS to the backside allows the frontside bitlines to be wider, which further reduces bitline resistance.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage, or mode of operation.

Those of skill in the art will appreciate that the information and signals described below may be represented using any of a variety of different technologies and techniques. For example, data, instructions, commands, information, signals, bits, symbols, and chips that may be referenced throughout the description below may be represented by voltages, currents, electromagnetic waves, magnetic fields or particles, optical fields or particles, or any combination thereof, depending in part on the particular application, in part on the desired design, in part on the corresponding technology, etc.

Further, many aspects are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, the sequence(s) of actions described herein can be considered to be embodied entirely within any form of non-transitory computer-readable storage medium having stored therein a corresponding set of computer instructions that, upon execution, would cause or instruct an associated processor of a device to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

FIG. 1A is a top view of a portion of a semiconductor structure 100 of a conventional static random access memory (SRAM). In some aspects, FIG. 1A merely shows some elements of the semiconductor structure 100 for illustration purposes, and other elements above and/or below the elements shown in FIG. 1A may be disposed but not shown in FIG. 1A. The SRAM consists of cross-coupled inverters, labeled INV1 and INV2.

As shown in FIG. 1A, the semiconductor structure 100 has a two rows of n-doped S/D structures, S/D 102*a* and S/D 102*b*, as well as two rows of p-doped S/D structures, S/D

104*a* and S/D 104*b*. As further shown in FIG. 1A, the semiconductor structure 100 includes gate stacks G1 and G2, spaced along a first direction (e.g., the x direction) and having a length along a second direction (e.g., the y direction). The gate stacks provide active channels from one epitaxial (EPI) source or drain (S/D) structure to another. As shown in FIG. 1A, the gate stacks have a contact poly-to-poly spacing (CPP). As further shown in FIG. 1A, gate stack G1 has cut between S/D 104*b* and S/D 102*b*, to create two gates, gate 106*a* and gate 106*b*, and gate stack G2 has a cut between S/D 102*a* and S/D 104*a* to create two gates, gate 106*c* and gate 106*d*.

As shown in FIG. 1A, the semiconductor structure 100 also includes front-side S/D contacts (FSDC) 108*a-h* and frontside gate contacts (FSGC) 110*a-b*. The FSGCs may also be frontside contacts over active gate (FSCOAG). As shown in FIG. 1A, front side jumper contacts (FSJCs), FSJC 111*a* and FSJC 111*b*, are used to connect FSDC 108*d* to gate 106*d* and to connect FSDC 108*e* to gate 106*a*, which creates the cross coupled inverter circuit. As further shown in FIG. 1A, there are minimum spacing limitations between FSDCs, an example of which is indicated at 112, showing the spacing between FSDC 108*a* and FSDC 108*b*.

Figure 1B:
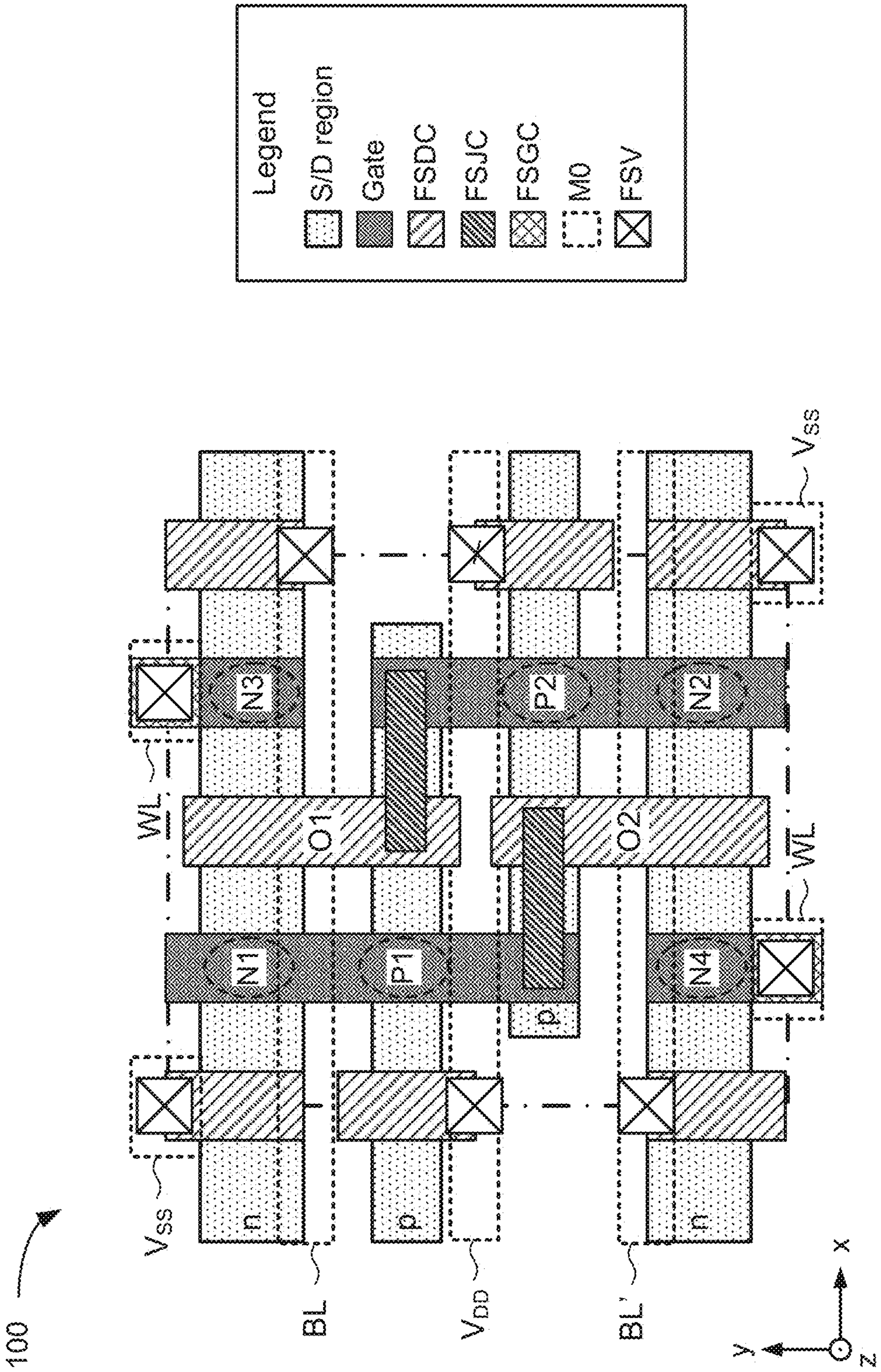

FIG. 1B is a top view of the semiconductor structure 100 showing other features omitted from FIG. 1A for clarity. In particular, FIG. 1B shows how VSS. VDD, word lines (WLs) and bit lines (BLs) are routed using front side, level-zero metal (M0) that is connected to FSDCs and FSGCs using frontside vias (FSVs). In addition, the individual FETs that make up the memory cell are identified: NFET N1 and PFET P1 make up INV1, NFET N2 and PFET P2 make up INV2, and NFET N3 and NFET N4 connect the outputs of the cross-coupled inverter pair to the bit lines BL and BL'.

Figure 1C:
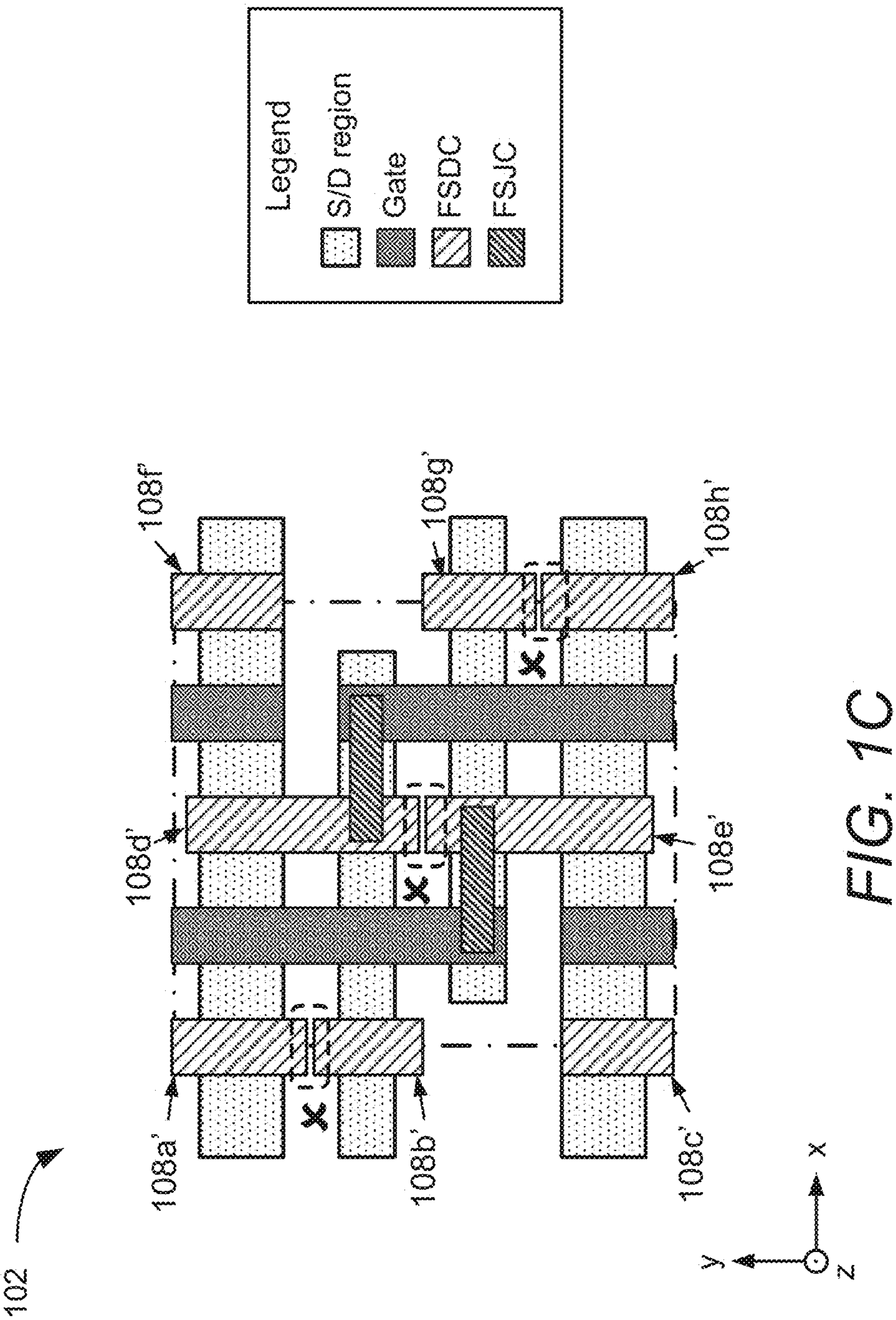
FIG. 1C is a top view of the semiconductor circuit in FIGS. 1A and 1B after it has been shrunk.

FIG. 1C is a top view of the semiconductor structure 100 after it has been shrunk, e.g., in anticipation of fabricating the semiconductor structure 100 using a wafer process that supports smaller feature sizes. In FIG. 1C, the shrunken features in FIG. 1C are distinguished from their un-shrunken counterparts in FIG. 1A by appending an apostrophe to the element number. As illustrated in FIG. 1C, the resulting layout 102 has some spacing violations, indicated in FIG. 1C by dotted boxes marked with an "x". In particular, the S/D 108*a*' is now too close to S/D 108*b*', S/D 108*d*' is now too close to S/D 108*e*', and S/D 108*g*' is now too close to S/D 108*h*'. The scaled-down semiconductor structure 102 suffers from other deficiencies as well. For example, the width of the bit lines BL and BL' also decreased; this increases the resistance of the bit lines, which limits the operational speed of the SRAM and increases power consumption and heat. Likewise, the width of the metal lines that provide VDD and VSS to the semiconductor structure 102 is also reduced; this increases supply line resistance, which limits the maximum size of the SRAM array and also increases power consumption and heat.

Figure 2A:
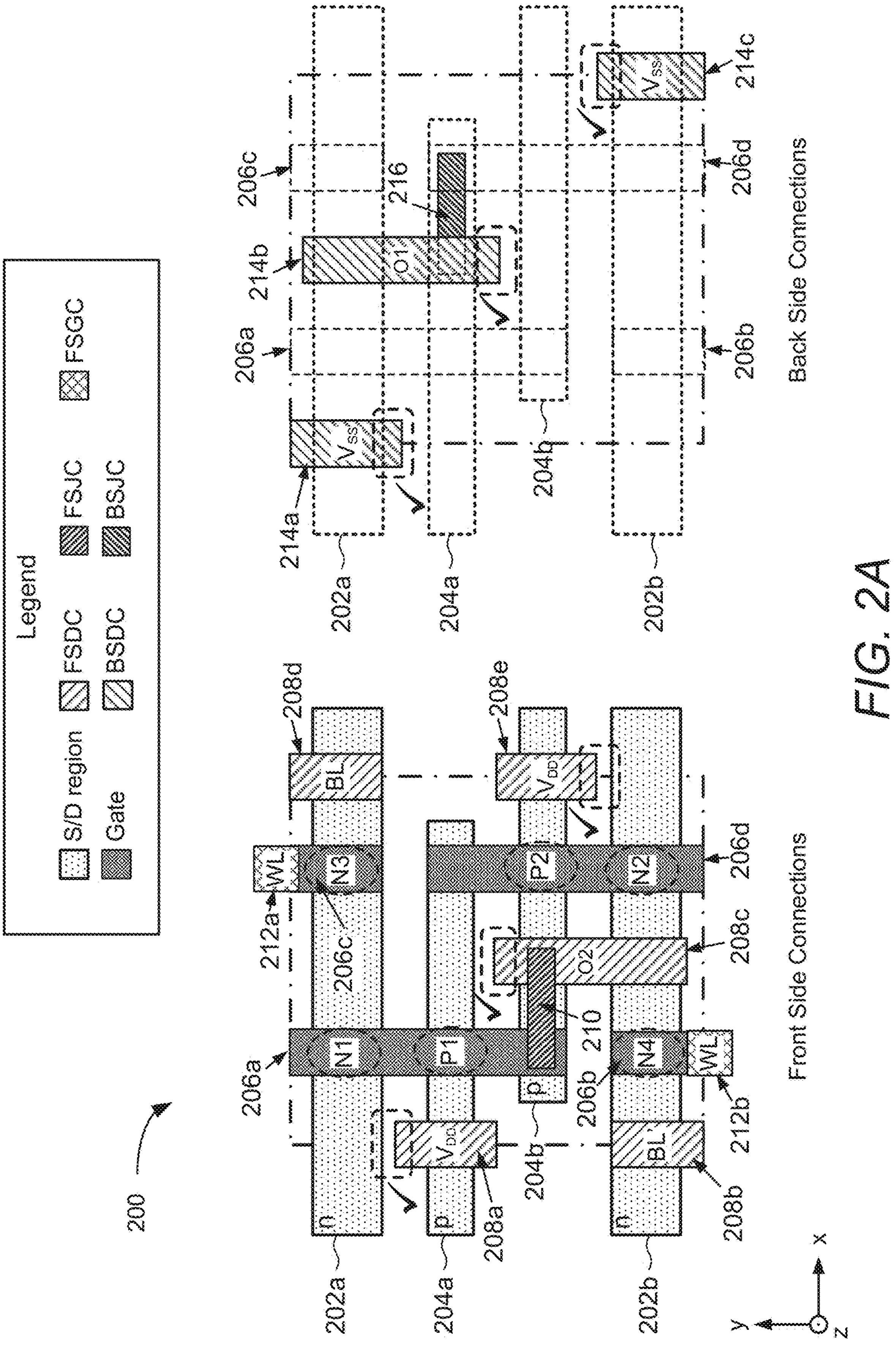
FIG. 2A illustrates simplified top views of a semiconductor structure of a compact memory cell using full backside connectivity, according to aspects of the disclosure.

FIG. 2A illustrates simplified top views of a semiconductor structure 200 of a compact memory cell using full backside connectivity, according to aspects of the disclosure. The left side of FIG. 2A shows the front side connections and the right side of FIG. 2A shows the back side connections. In particular, the elements shown on the left side of FIG. 2A may be above the elements shown on the right side of FIG. 2A in a vertical direction (e.g., the z direction corresponding to a direction leaving the plane of the drawing sheet). In some aspects, FIG. 2A merely shows some elements of the semiconductor structure 200 for illustration purposes, and other elements above and/or below the elements shown in FIG. 2A may be disposed but not shown in FIG. 2A.

As shown in FIG. 2A, the compact memory cell differs from the conventional semiconductor structures 100 and 102 in that some of the power and signal routing connections are provided on the back side of the semiconductor structure 200.

In the example shown in FIG. 2A, the semiconductor structure 200 has two n-type S/D EPI regions, S/D 202*a* and S/D 202*b*, and two p-type S/D EPI regions, S/D 204*a* and S/D 204*b*. The semiconductor structure 200 has two gate stacks that have been cut to form gate 206*a*, gate 206*b*, gate 206*c*, and gate 206*d*. The NFETs and PFETs created by the gate and S/D structures are labeled P1-2, and N1-4. The semiconductor structure 200 has five frontside S/D contacts, FSDC 208*a-e*, as well as an FSJC 210. In some aspects, the semiconductor structure 200 may have at least one FSGC, such as FSGC 212*a* and FSGC 212*b*, which are wordline connections.

As shown in FIG. 2A, the semiconductor structure 200 has three backside S/D contacts, BSDC 214*a*, BSDC 214*b*, and BSDC 214*c*, and a backside jumper contact (BSJC) 216 that straddles both a gate structure and a diffusion structure and electrically connects both. In some aspects, the semiconductor structure may have at least one BSGC (not shown in FIG. 2A). As can be seen in FIG. 2A, the ground connection to NFET N1 is provided by BSDC 214*a* and the ground connection to NFET N2 is provided by BSDC 214*c*. As a result, the locations of the spacing violations in the semiconductor structure 100, indicated in FIG. 2A by dotted boxes, do not have spacing violations in the semiconductor structure 200.

Figure 2B:
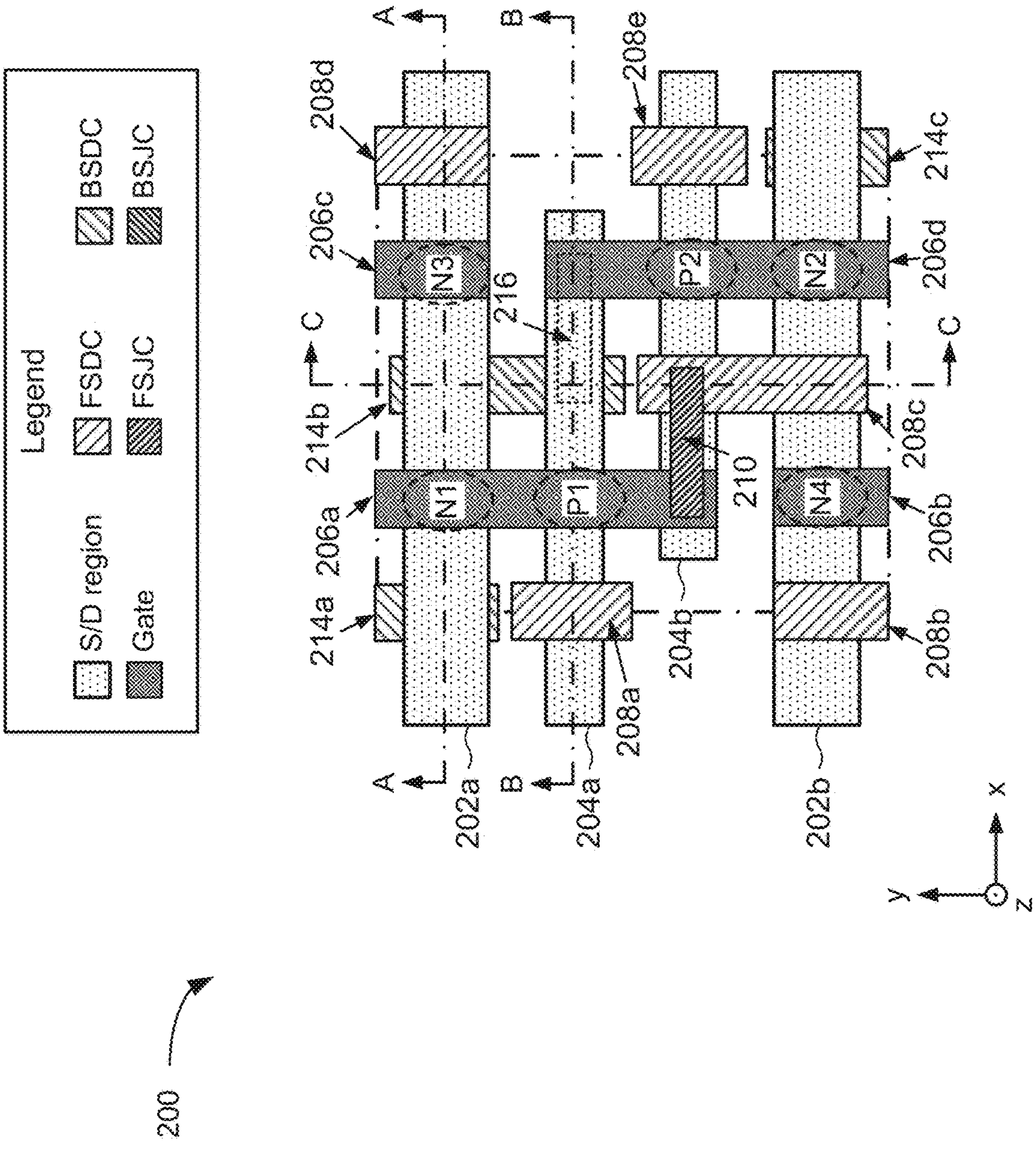
FIG. 2B is a simplified top view of the semiconductor structure showing the relative locations of all of the components shown in the left and right sides of FIG. 2A.

FIG. 2B is a simplified top view of the semiconductor structure 200 showing the relative locations of all of the components shown in the left and right sides of FIG. 2A. FIG. 2B also shows the locations of cross sections A-A, B-B, and C-C, each of which will be shown in a following figure.

Figure 2C:
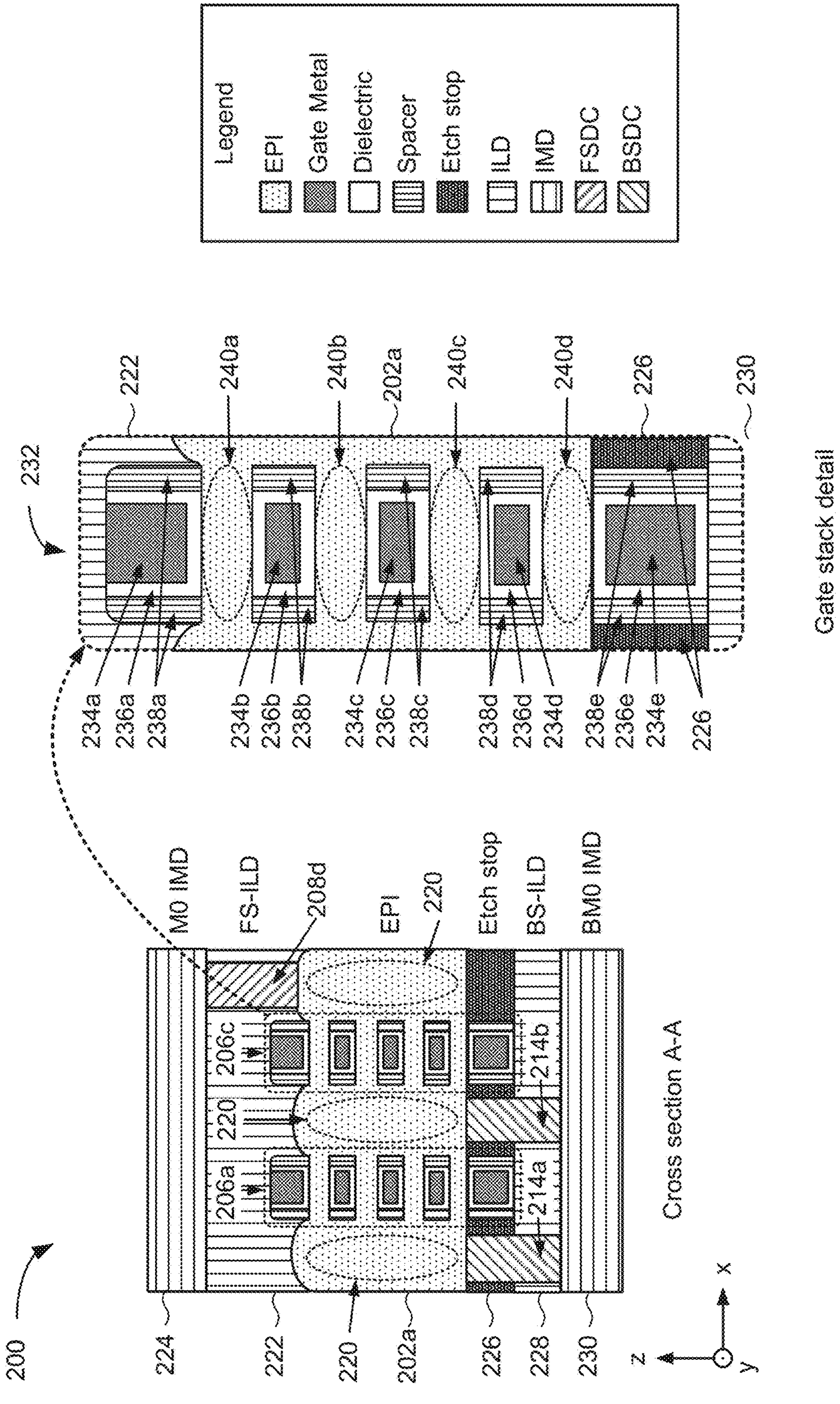
FIG. 2C is a cross-sectional view of the semiconductor structure along cut line A-A, according to aspects of the disclosure.

FIG. 2C is a cross-sectional view of the semiconductor structure 200 along cut line A-A, according to aspects of the disclosure. In the example shown in FIG. 2C, the gate 206*a* and gate 206*c* divide S/D 202*a* into different S/D regions 220. Above the EPI layer is a frontside inter-layer dielectric (FS-ILD) layer 222 that covers the gate 206*a* and gate 206*c*. The FSDC 208*d* connects to a S/D region 220 through the FS-ILD layer 222. Above the FS-ILD layer 222 is a frontside metal zero (M0) inter-metal dielectric (M0-IMD) layer 224.

In the example shown in FIG. 2C, an etch stop layer 226 separates the EPI layer from a backside inter-layer dielectric (BS-ILD) layer 228. The etch stop layer 226 is located below the S/D 202*a* and surrounds a bottom portion of each gate stack. The etch stop layer 226 blocks the EPI growth from the substrate and serves as an etch stop layer for the BSDCs (but not for the BSJCs). The etch stop layer 226 also serves as an isolation layer between BSJCs and the S/D structures to prevent a short circuit between the BSJCs and the S/D structures. Example materials used for the etch stop layer 226 include, but are not limited to, SiON, SiCON, SiN, or a combination thereof. In some aspects, a lower surface of the etch stop layer 226 may be at about the same level of a lower surface of the gate structures of the gate stacks.

The BSDC 214*a* and BSDC 214*b* go through the BS-ILD layer 228 and the etch stop layer 226 to make contact with their respective S/D regions 220 within the S/D 202*a*. Below the BS-ILD layer 228 is a backside metal zero (BM0) inter-metal dielectric (BM0-IMD) layer 230.

FIG. 2C includes an enlarged area 232 showing the structure of gate 206*c* in more detail. In the example shown in FIG. 2C, each gate structure is a gate-all-around (GAA) design that includes five gate portions, each including a respective gate electrode (e.g., gate electrodes 234*a-e*) and a respective gate dielectric structure (e.g., gate dielectric structures 236*a-e*). In this disclosure, all the gate electrodes in a gate stack may be collectively referred to as a gate electrode structure 234. In some aspects, a top gate portion of the gate stack may include gate spacers 238*a-e* on sidewalls of the respective gate dielectric structures 236*a-c*. The enlarged area 232 also shows the locations of channels 240*a-d*, through which charge carriers travel horizontally from left to right or from right to left in the figure.

Figure 2D:
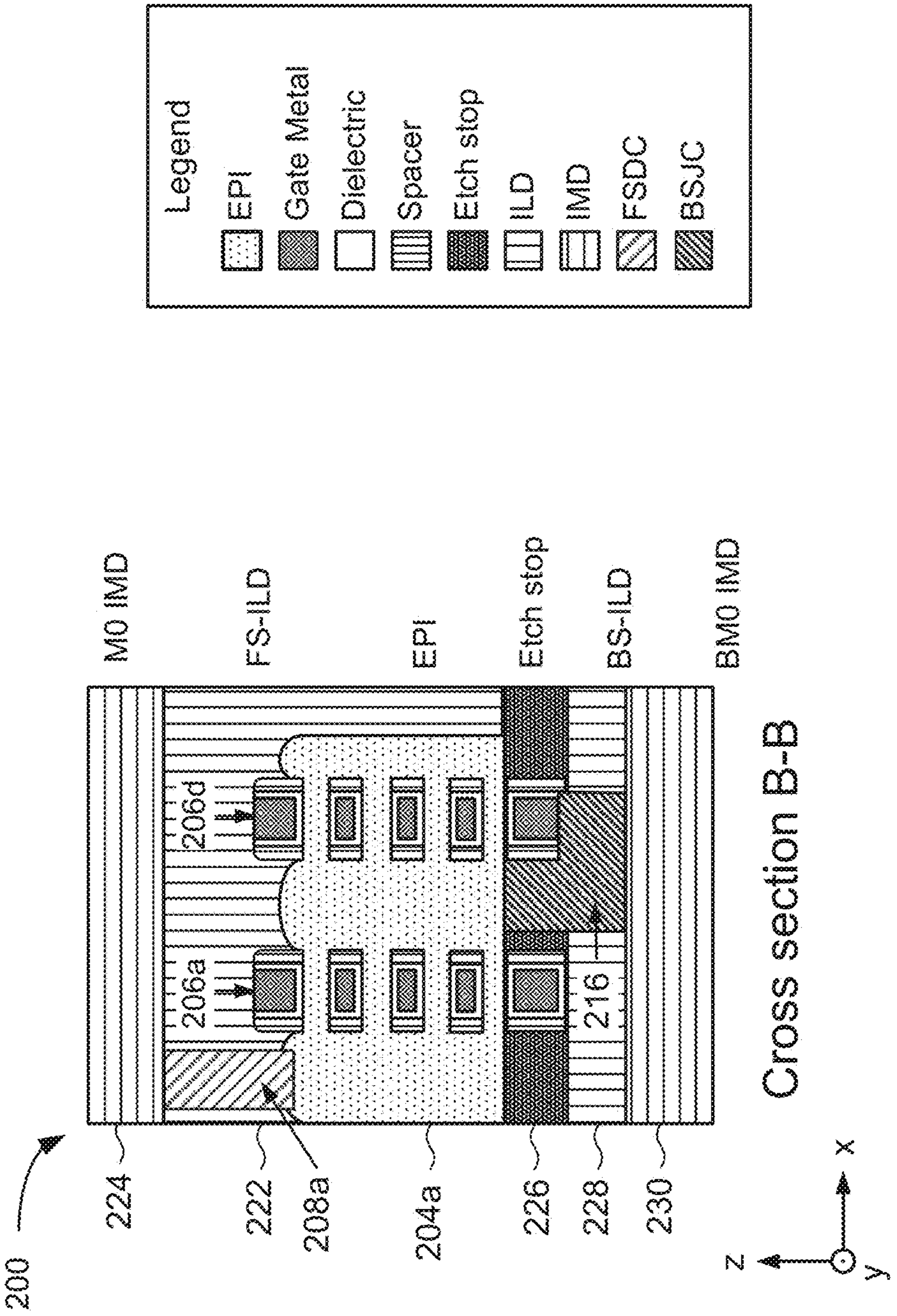
FIG. 2D is a cross-sectional view of the semiconductor structure along cut line B-B, according to aspects of the disclosure.

FIG. 2D is a cross-sectional view of the semiconductor structure 200 along cut line B-B, according to aspects of the disclosure. In addition to the cross-sections of the M0 IMD layer 224, the S/D 202*a*, the FS-ILD layer 222, the M0 IMD layer 224, the etch stop layer 226, the BS-ILD layer 228, and the BM0 IMD layer 230, FIG. 2C shows the cross sections of the gate 206*a*, the gate 206*d*, the FSDC 208*a*, the BSDC 214*b*, and the BSJC 216.

Figure 2E:
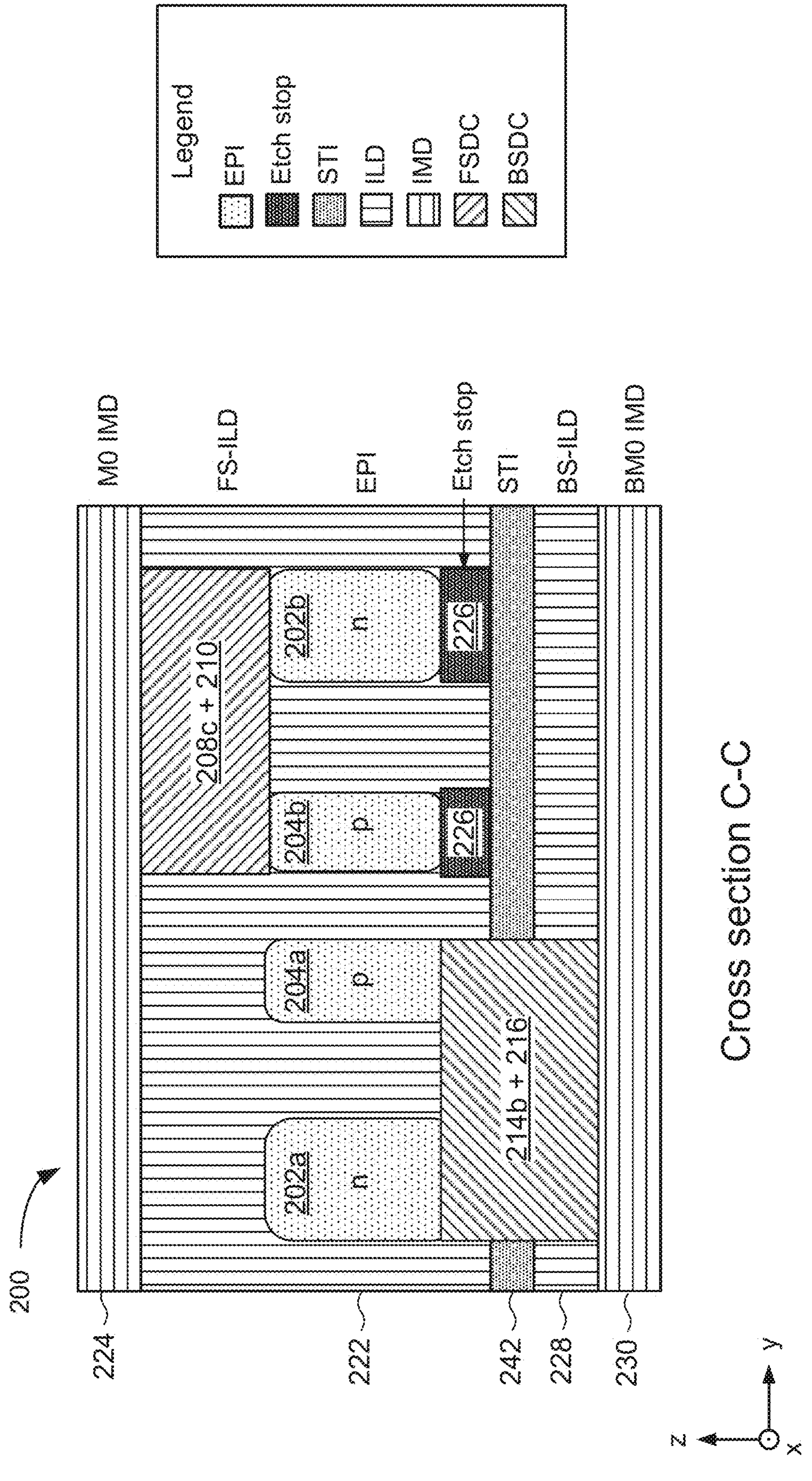
FIG. 2E is a cross-sectional view of the semiconductor structure along cut line C-C, according to aspects of the disclosure.

FIG. 2E is a cross-sectional view of the semiconductor structure 200 along cut line C-C, according to aspects of the disclosure. In addition to the cross-sections of the S/D 202*a*, the S/D 202*b*, the S/D 204*a*, the S/D 204*b*, FS-ILD layer 222, the M0 IMD layer 224, the etch stop layer 226, the BS-ILD layer 228, and the BM0 IMD layer 230, FIG. 2D shows the cross sections of a shallow trench isolation (STI) layer 242, the combination of FSDC 208*c* and FSJC 210, and the combination of BSDC 214*b* and BSJC 216.

Figure 3:
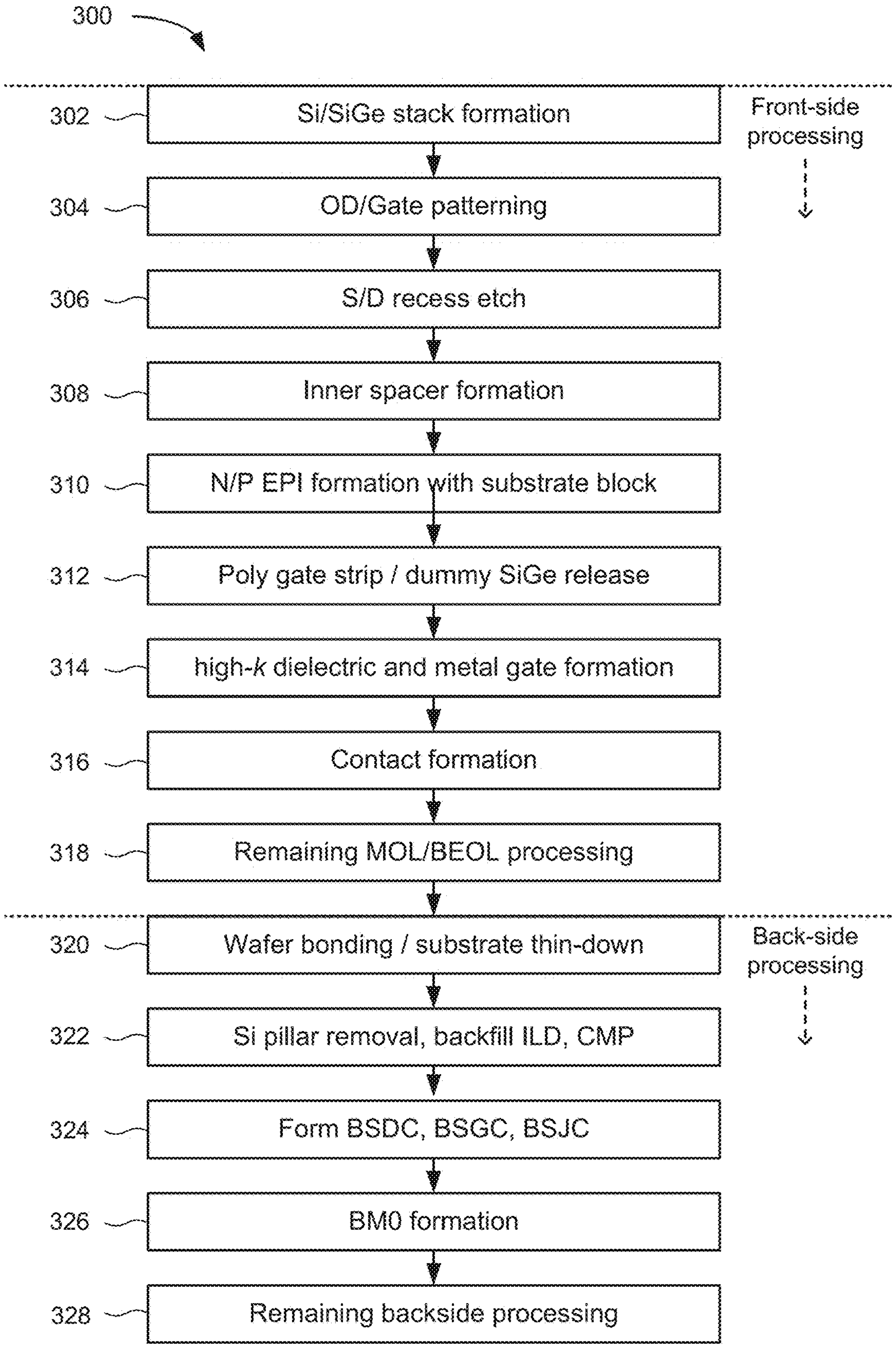
FIG. 3 is a flow chart of a simplified process for fabricating a compact memory cell, according to aspects of the disclosure.

FIG. 3 is a flow chart of a simplified process 300 for fabricating a compact memory cell, such as the semiconductor structure 200, according to aspects of the disclosure. As shown in FIG. 3, the simplified process 300 includes front-side processing steps followed by back-side processing steps.

As shown in FIG. 3, the front-side processing steps may include, at 302, formation of the silicon (Si) and/or germanium (Ge) gate stack.

As shown in FIG. 3, the front-side processing steps may include, at 304, oxide diffusion (O/D) and gate patterning.

As shown in FIG. 3, the front-side processing steps may include, at 306, etching source/drain recesses.

As shown in FIG. 3, the front-side processing steps may include, at 308, formation of inner spacers.

As shown in FIG. 3, the front-side processing steps may include, at 310, N-type and P-type EPI formation with substrate block (EPI block).

As shown in FIG. 3, the front-side processing steps may include, at 312, poly gate strip and/or dummy SiGe release.

As shown in FIG. 3, the front-side processing steps may include, at 314, formation of high-k dielectric and metal gate structures.

As shown in FIG. 3, the front-side processing steps may include, at 316, formation of contacts.

As shown in FIG. 3, the front-side processing steps may include, at 318, any remaining middle of line (MOL) or back-end-of-line (BEOL) processing steps.

As shown in FIG. 3, the back-side processing steps may include, at 320, wafer bonding and/or substrate thin-down.

As shown in FIG. 3, the back-side processing steps may include, at 322, Si pillar removal, backfill ILD, and chemical/mechanical polishing (CMP).

As shown in FIG. 3, the back-side processing steps may include, at 324, formation of BSDC. BSGC, and/or BSJC structures.

As shown in FIG. 3, the back-side processing steps may include, at 326, formation of BM0 structures.

As shown in FIG. 3, the back-side processing steps may include, at 328, any remaining back-side processing steps.

Figure 4C:
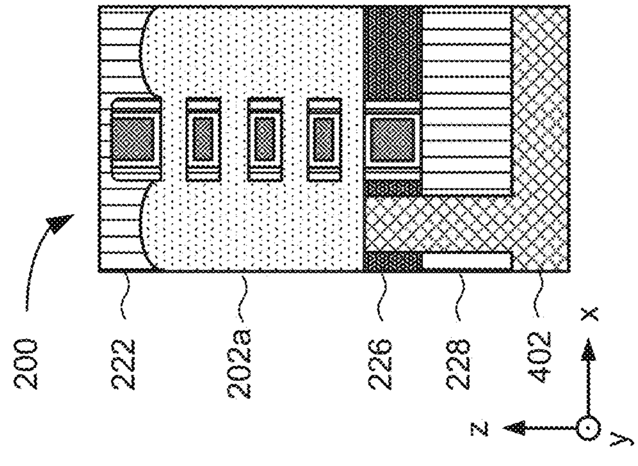
FIGS. 4A-4F are cross-sections that illustrate steps in a process for fabricating a backside jumper contact (BSJC) used for full backside connectivity, according to aspects of the disclosure.
Figure 4B:
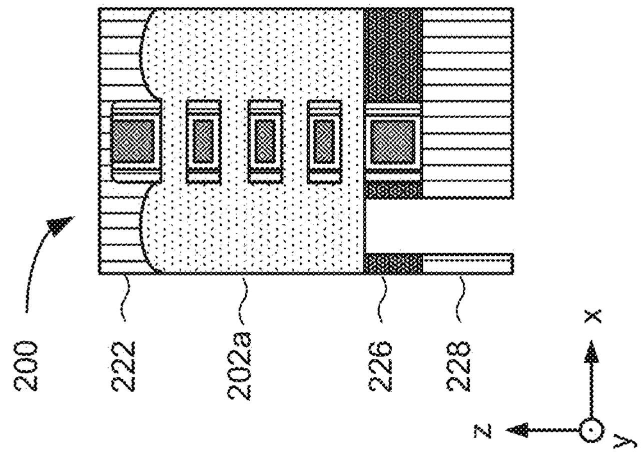
Figure 4A:
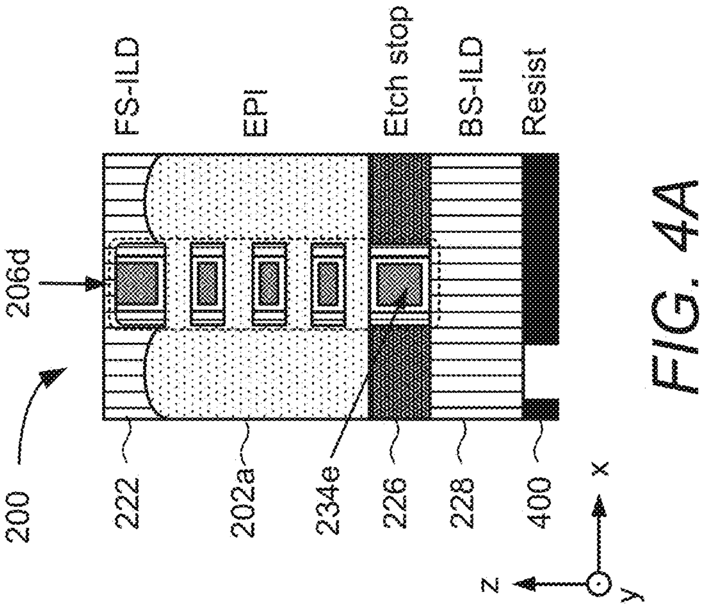

FIGS. 4A-4F are cross-sections that illustrate steps in a process for fabricating a BSJC used for full backside connectivity, according to aspects of the disclosure. As shown in FIG. 4A, the process starts with a semiconductor structure, such as a partially completed semiconductor structure 200, comprising a gate stack, e.g., gate 206*d*, an EPI layer, a FS-ILD layer 222, an etch stop layer 226, and a BS-ILD layer 228.

FIG. 4A illustrates the result after application of a first resist layer 400 and a patterning processes, which may be referred to herein as a BSDC lithography step.

FIG. 4B illustrates the result after a BSDC etching process that etches through the BS-ILD layer 228 and the etch stop layer 226 but stops at the EPI structure S/D 202*a*, and a resist ash process that removes the first resist layer 400.

FIG. 4C illustrates the result after fill patterning process that deposits material 402 into the BSDC hole. In some aspects, material 402 may comprise a spin-on oxide, a carbide, or a low-temp oxide (LTO). The material 402 serves the purpose of being a sacrificial gap fill material that will be later fully removed.

Figure 4F:
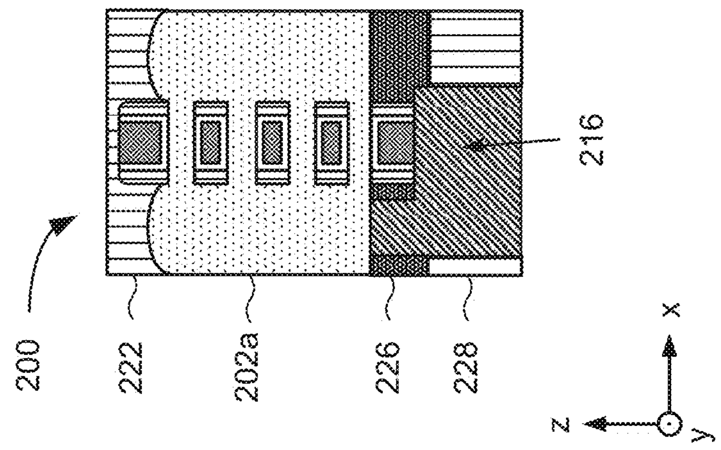
Figure 4E:
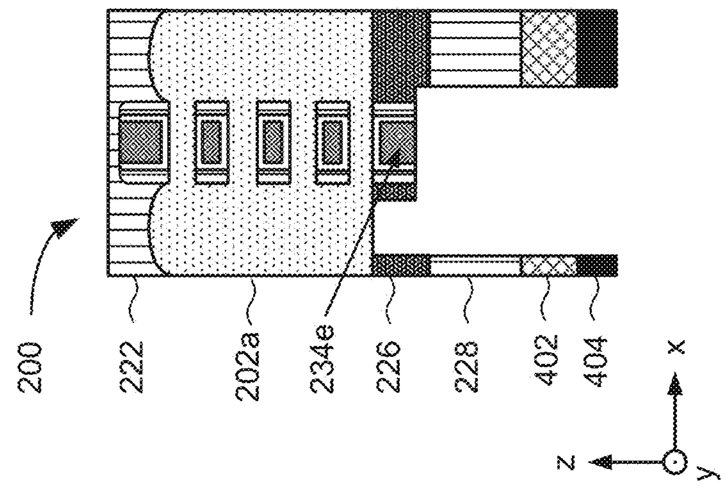
Figure 4D:
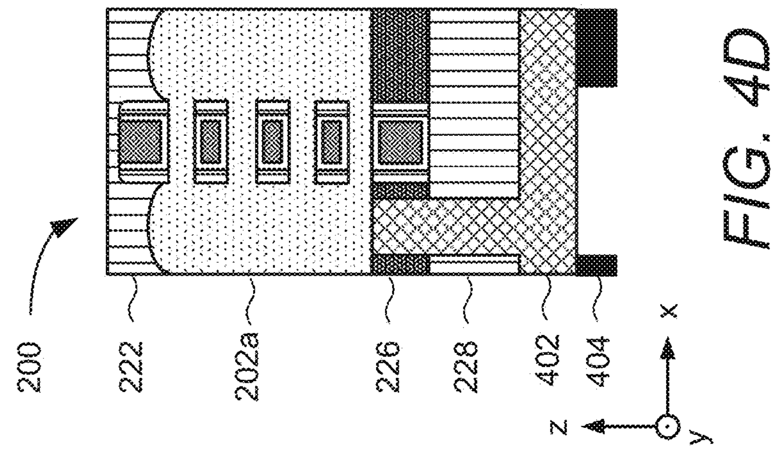

FIG. 4D illustrates the results after application of a second resist layer 404 and a patterning process, which may be referred to herein as a BSJC lithography step.

FIG. 4E illustrates the result after a BSJC etching process that etches through the material 402 and the BS-ILD layer 228 and some distance into the gate metal 234*c*.

FIG. 4F illustrates the result after removal of the second resist layer 404, co-metallization of a BSJC 216 and BSDCs, if any (e.g., BSDC 214*b*), removal of material 402, and a planarization step such as CMP. Materials for the BSJC 216 may include, but are not limited to, tungsten, cobalt, molybdenum, and ruthenium.

In addition to the challenges caused by reduction in wafer process feature sizes, SRAM usage in particular is increasing in SOC designs, in some cases occupying more than 50% of the chip area. As wafer process feature sizes become smaller, the metal conductors such as power, ground, bitlines, and wordlines become thinner and their resistance becomes larger. Bitline resistance in particular can become a limiting factor in how bit a memory array can be, how fast it can operate, and how much power it consumes. Thus, it is desirable to reduce the resistance and/or capacitance of critical conductors such as bitlines.

The following figures illustrate techniques in which full backside connectivity may be used to achieve such reductions, including (a) bitline strapping using frontside metal zero (M0) and backside metal zero (BM0), which reduces bitline resistance, and (b) relocation of bitlines away from power and ground lines, which allows wider bitlines to reduce resistance, and greater separation of the bitlines from gate contacts and power supply lines, which reduces bitline capacitance. It is noted that these techniques may be used individually or in combination with each other. The use of one or more of these techniques can reduce the resistance of bitlines by more than 50% within the cell itself, and can eliminate the need for higher-level metal strapping, which itself can eliminate complicated strapping strategies at the cell placement phase of design, and can free up higher-level metal resources for other purposes, which can allow for further area reduction of large memory block layouts.

Figure 5A:
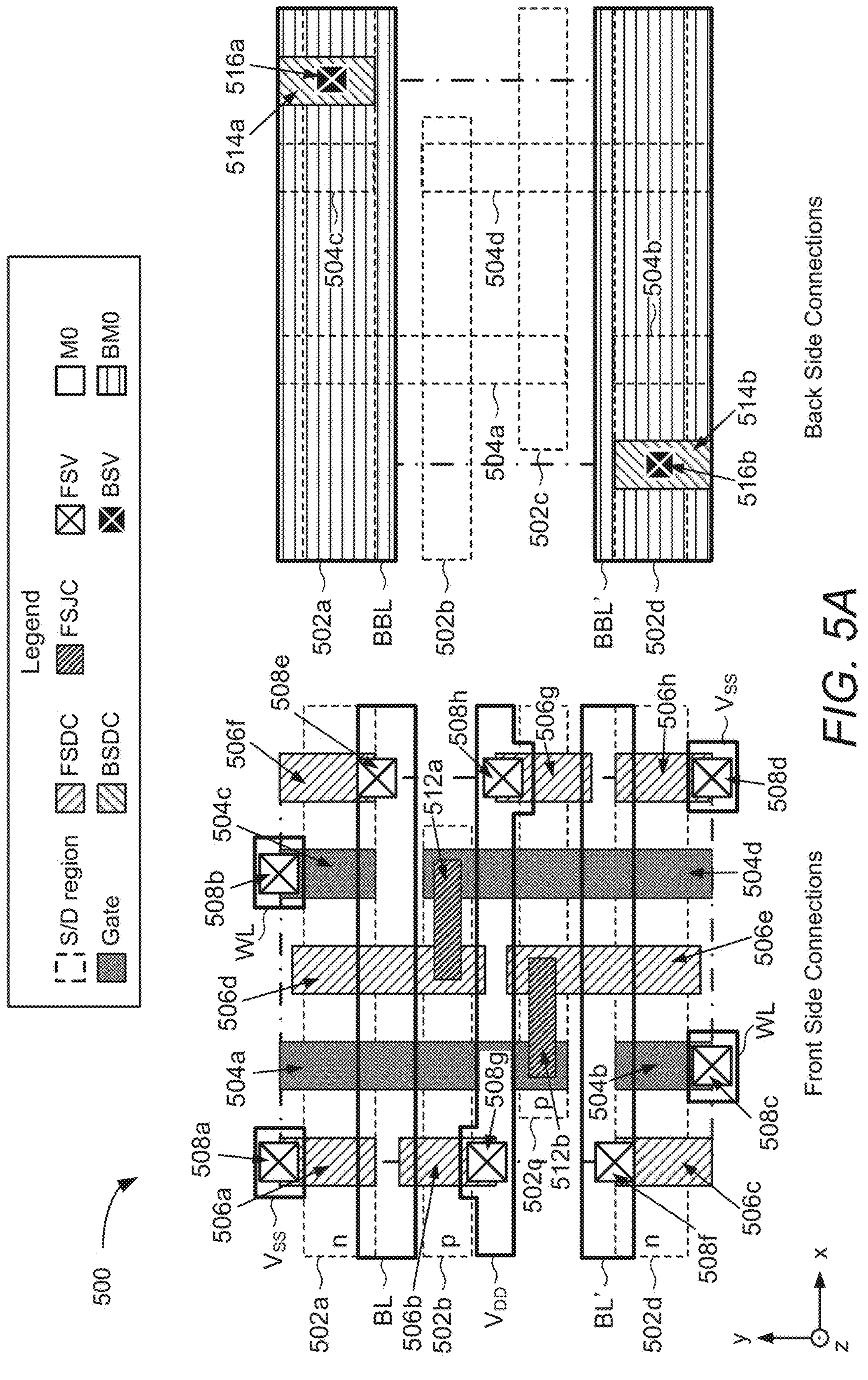
FIGS. 5A-5C illustrate simplified top views of semiconductor structures of compact memory cells using full backside connectivity, according to aspects of the disclosure.
Figure 5B:
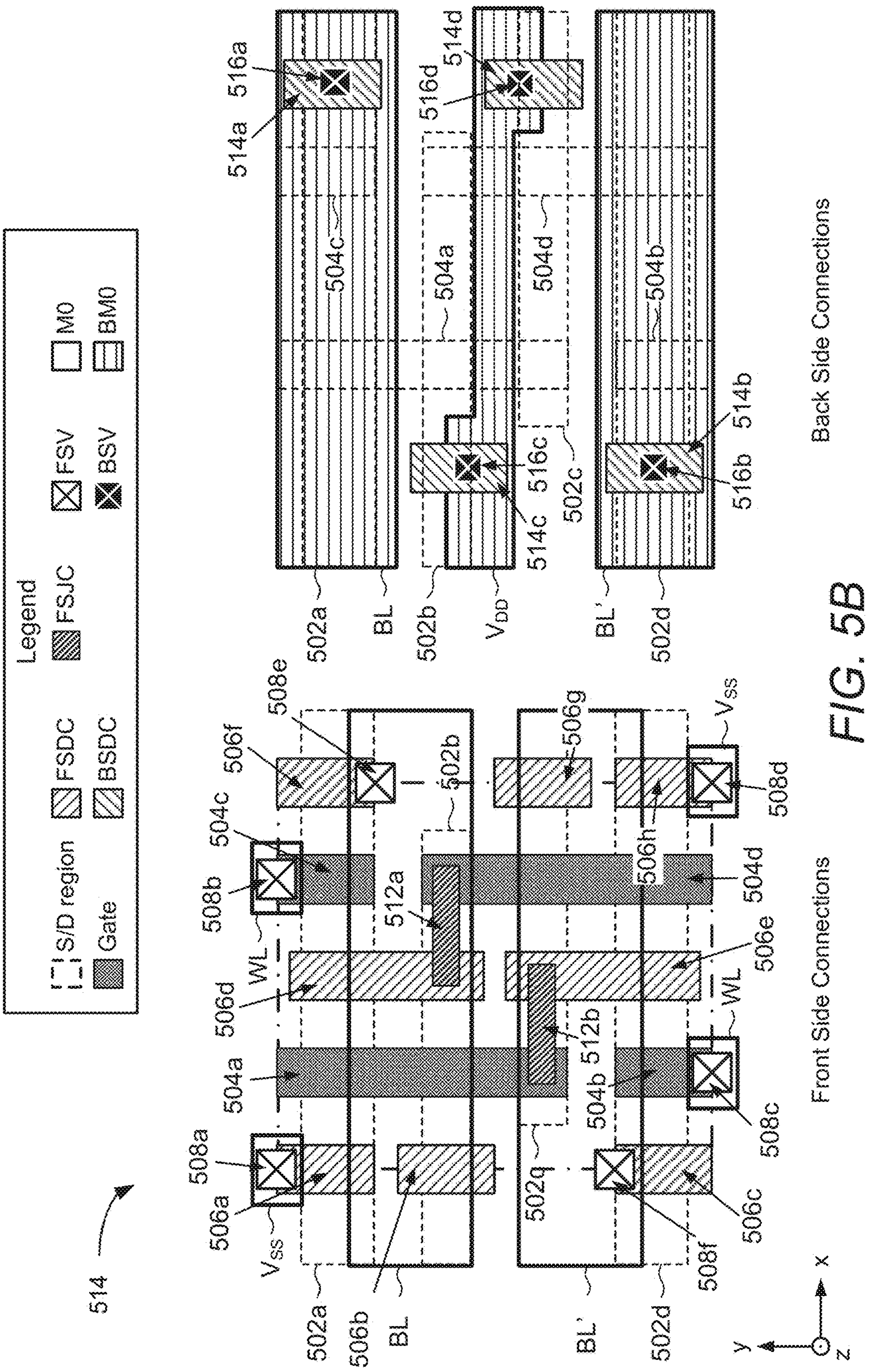
Figure 5C:
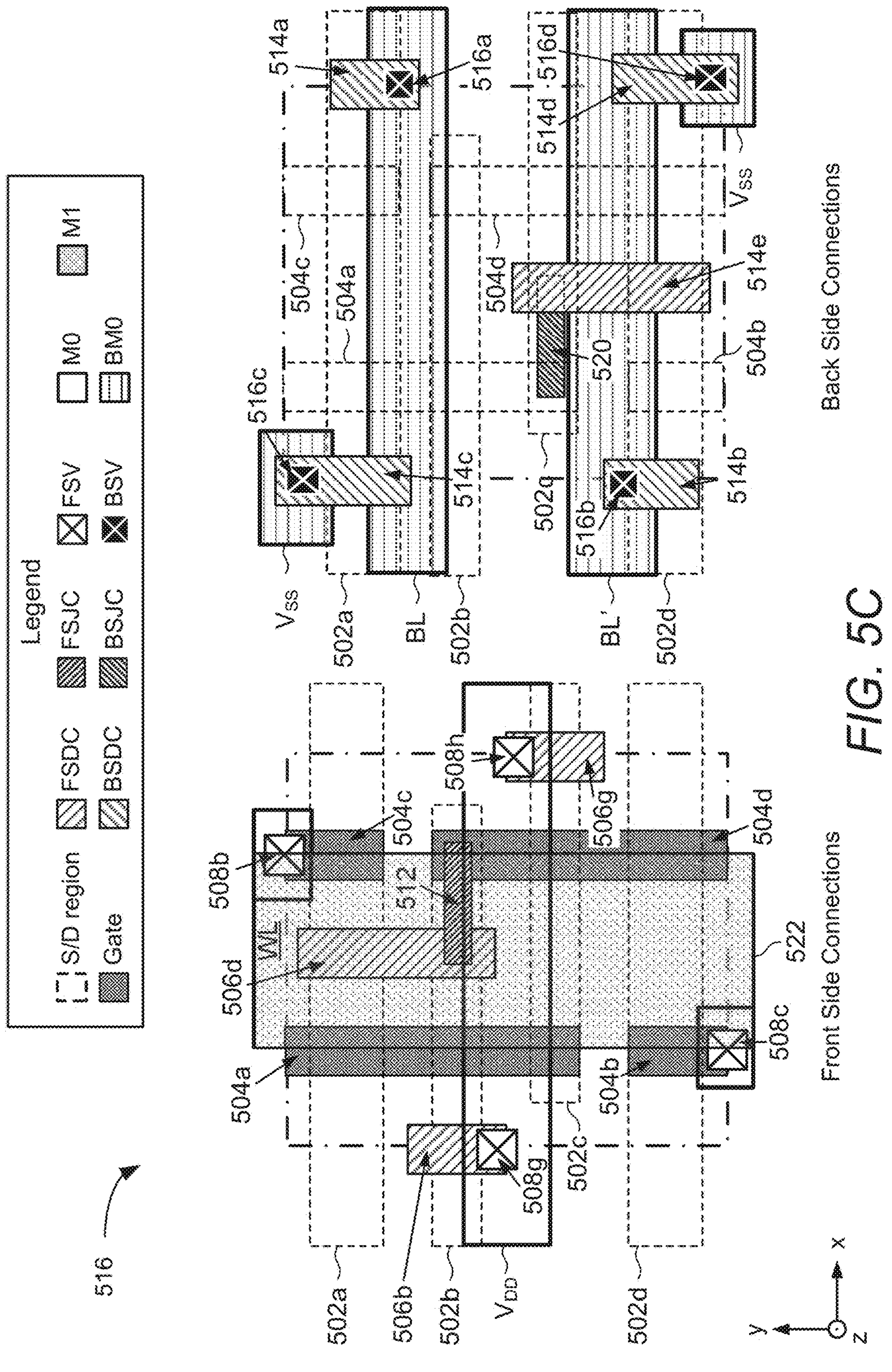

FIG. 5A, FIG. 5B, and FIG. 5C illustrate simplified top views of semiconductor structures of compact memory cells using full backside connectivity, according to aspects of the disclosure. For each of FIG. 5A, FIG. 5B, and FIG. 5C, the left side of the figure shows the frontside connections and the right side of the figures shows the backside connections. In particular, the elements shown on the left side of the figures may be above the elements shown on the right side of the figure in a vertical direction (e.g., the z direction corresponding to a direction leaving the plane of the drawing sheet).

FIG. 5A and FIG. 5B show top views of semiconductor structures 500 and semiconductor structure 514, respectively, according to aspects of the disclosure. FIGS. 5A and 5B show how backside connectivity may be used to reduce bitline resistance. FIG. 5C shows top views of a semiconductor structure 516, showing how backside connectivity may be used to reduce bitline capacitance. In some aspects, FIGS. 5A-5C merely show some elements of the semiconductor structures 500 and 502 for illustration purposes, and other elements above and/or below the elements shown in FIGS. 5A-5C may be disposed but not shown in FIGS. 5A-5C. In the examples shown in FIG. 5A-5C, each of the semiconductor structures 500, 514, and 516 includes four EPI S/D regions, S/D 502*a-d*, four gate stacks, gate 504*a-d*, and eight frontside S/D contacts, FSDC 506*a-h*.

In the example shown in FIG. 5A, the semiconductor structure 500 includes seven frontside vias, FSV 508*a-h*, two frontside gate contacts, FSGC 510*a-b*, and two FSJCs, FSJC 512*a-b*. The semiconductor structure 500 includes two backside S/D contacts, BSDC 514*a-b*, and two backside vias, BSV 516*a-b*. In the example shown in FIG. 5A, the frontside bitline structures labeled BL and BL' are connected in parallel with backside bitline structures labeled BBL and BBL'. Specifically, BL is electrically connected in parallel to BBL, and BL' is electrically connected in parallel to BBL'. In the example shown in FIG. 5A, BL is connected to BBL via the conducting path comprising FSV 508*c*, FSDC 506*f*, S/D 502*a*, BSDC 514*a*, and BSV 516*a*. In the example shown in FIG. 5*a*, BL' is connected to BBL' via the conducting path comprising FSV 508*f*. FSDC 506*c*, S/D 502*d*, BSDC 514*b*, and BSV 516*b*. In some aspects, the semiconductor structure 500 comprises an SRAM cell that is repeated in rows (e.g., along the x axis); in these aspects, the frontside and backside bitlines are strapped together periodically by way of the conducting paths described above. The reduced bitline resistance allows longer rows of memory cells, faster operation, and better performance.

In the example shown in FIG. 5B, the semiconductor structure 514 includes frontside vias FSV 508*a-f*, two frontside gate contacts, FSGC 510*a-b*, and two FSJCs, FSJC 512*a-b*, and the frontside bitlines are strapped to the backside bitlines via BSDC 514*a-b* and BSV 516*a-b*. In this embodiment, however, the frontside bitlines BL and BL' are wider than the corresponding frontside bitlines in FIG. 5A because in FIG. 5B there is not frontside VDD line—a backside VDD line is used instead. In the example shown in FIG. 5B, the backside VDD provides power via BSV 516*c-d* and BSDC 514*c-d*. In the example shown in FIG. 5B, the combination of wide frontside and backside bitlines electrically connected to each in parallel provides even lower bitline resistance. In addition, the backside VDD line in FIG. 5B may be made wider than the frontside VDD line in FIG. 5A, which reduces the VDD line resistance and also allows longer rows of memory cells, faster operation, and better performance.

In the example shown in FIG. 5C, the semiconductor structure 516 includes frontside S/D contacts FSDC 506*b*, FSDC 506*d*, and FSDC 506*g*, frontside vias FSV 508*b-c* and FSV 508*g-h*, an FSJC 512, backside S/D contacts BSDC 514*a-e*, backside vias BSV 516*a-b*, and a BSJC 520. In this embodiment, however, both the bitlines BL and BL' are on the backside only, and rather than a frontside VSS, two backside VSS lines, $V_{SS1}$ and $V_{SS2}$ are used to supply VSS via BSDC 514*c* and BSDC 514*d* via backside contacts BSV 516*c* and BSV 516*d*. In the example shown in FIG. 5C, a wide metal one (M1) conductor 522 provides a low resistance wordline. Moving the bitlines to the backside and increasing their widths reduces the gate-to-contact capacitance and the bitline-to-VDD capacitance. Having the VDD and wordline metal on the frontside also reduces bitline capacitance. moving the VSS to the backside also allows the frontside wordlines to be wider that the corresponding wordlines in FIG. 5A, which reduces wordline resistance.

Figure 6:
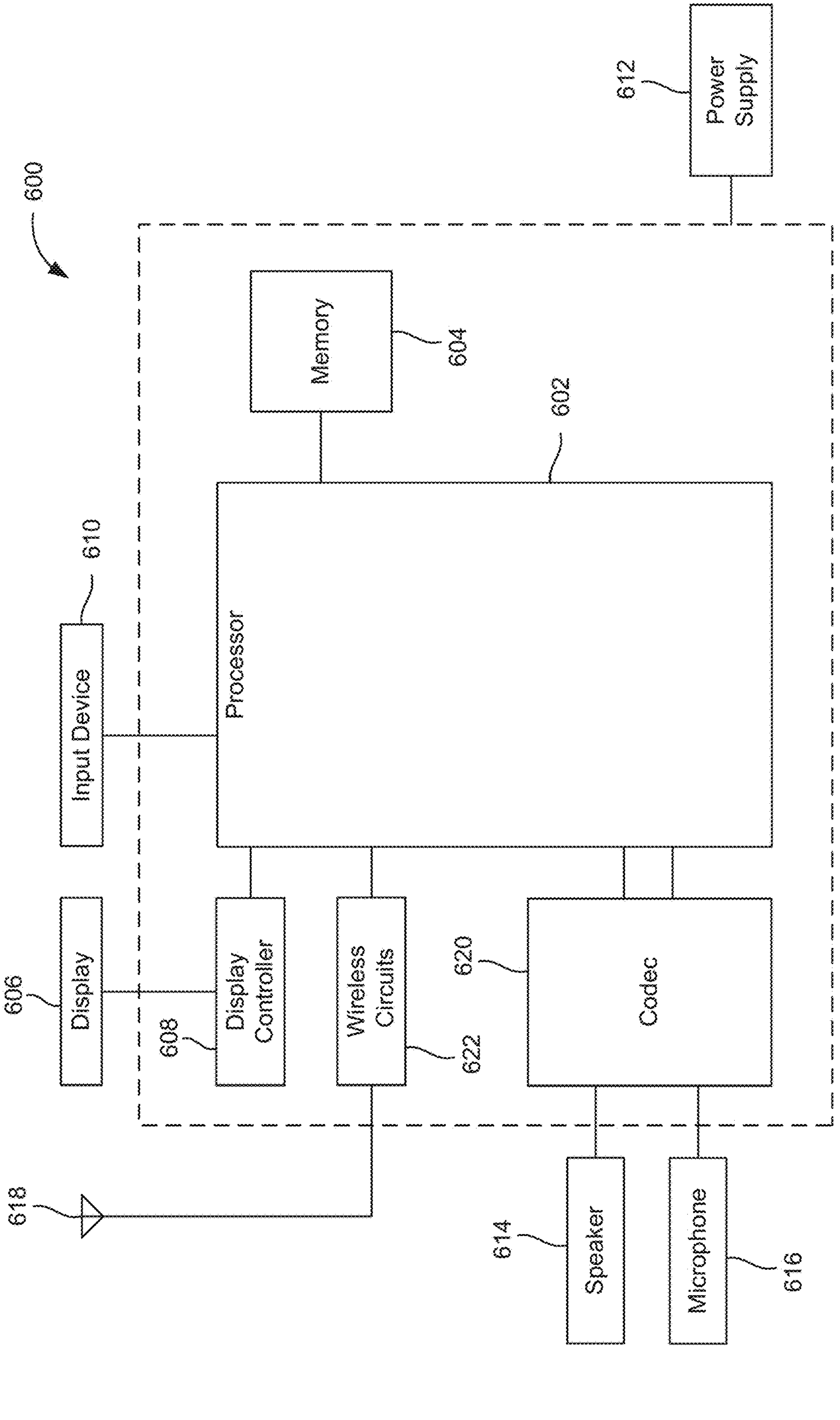
FIG. 6 illustrates a mobile device in accordance with some examples of the disclosure.

FIG. 6 illustrates a mobile device 600, according to aspects of the disclosure. In some aspects, the mobile device 600 may be implemented by including one or more IC devices manufactured based on the examples described in this disclosure.

In some aspects, mobile device 600 may be configured as a wireless communication device. As shown, mobile device 600 includes processor 602. Processor 602 may be communicatively coupled to memory 604 over a link, which may be a die-to-die or chip-to-chip link. Mobile device 600 also includes display 606 and display controller 608, with display controller 608 coupled to processor 602 and to display 606. The mobile device 600 may include input device 610 (e.g., physical, or virtual keyboard), power supply 612 (e.g., battery), speaker 614, microphone 616, and wireless antenna 618. In some aspects, the power supply 612 may directly or indirectly provide the supply voltage for operating some or all of the components of the mobile device 600.

In some aspects, FIG. 6 may include coder/decoder (CODEC) 620 (e.g., an audio and/or voice CODEC) coupled to processor 602; speaker 614 and microphone 616 coupled to CODEC 620; and wireless circuits 622 (which may include a modem, RF circuitry, filters, etc.) coupled to wireless antenna 618 and to processor 602.

In some aspects, one or more of processor 602, display controller 608, memory 604, CODEC 620, and wireless circuits 622 may include one or more IC devices including semiconductor structures manufactured according to the examples described in this disclosure.

It should be noted that although FIG. 6 depicts a mobile device 600, similar architecture may be used to implement an apparatus including a set top box, a music player, a video player, an entertainment unit, a navigation device, a personal digital assistant (PDA), a fixed location data unit, a computer, a laptop, a tablet, a communications device, a mobile phone, or other similar devices.

Figure 7:
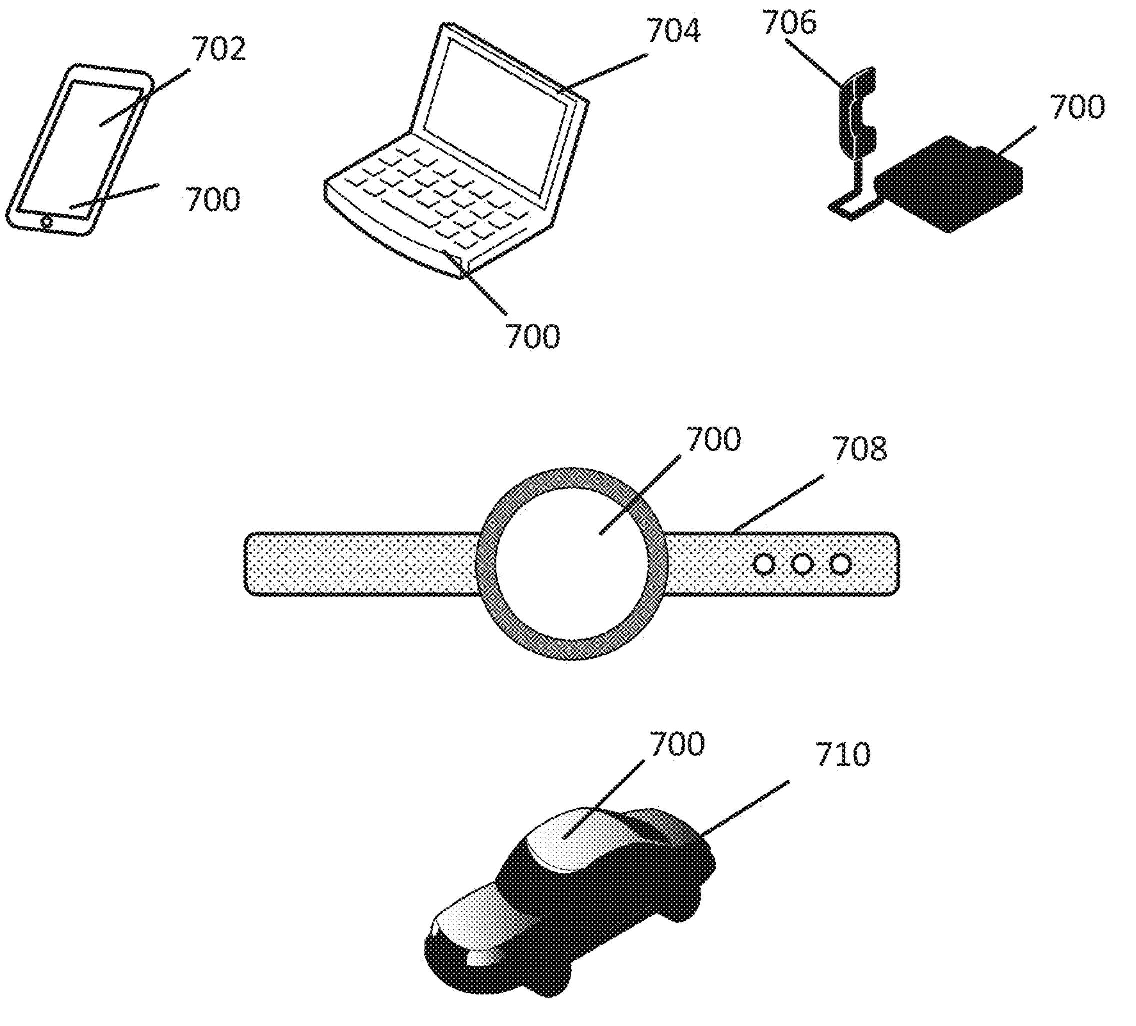
FIG. 7 illustrates various electronic devices that may be integrated with any of the aforementioned integrated device or semiconductor device in accordance with various examples of the disclosure.

FIG. 7 illustrates various electronic devices that may be integrated with any of the aforementioned devices, semiconductor devices, integrated circuit (IC) packages, integrated circuit (IC) devices, semiconductor devices, integrated circuits, electronic components, interposer packages, package-on-package (POP), System in Package (SiP), or System on Chip (SoC). For example, a mobile phone device 702, a laptop computer device 704, a fixed location terminal device 706, a wearable device 708, or automotive vehicle 710 may include a semiconductor device 700 (which may include semiconductor structures 200, 500, 514, and 516) as described herein. The devices 702, 704, 706 and 708 and the vehicle 710 illustrated in FIG. 7 are merely exemplary. Other apparatuses or devices may also feature the semiconductor device 700 including, but not limited to, a group of devices that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

In the detailed description above it can be seen that different features are grouped together in examples. This manner of disclosure should not be understood as an intention that the example clauses have more features than are explicitly mentioned in each clause. Rather, the various aspects of the disclosure may include fewer than all features of an individual example clause disclosed. Therefore, the following clauses should hereby be deemed to be incorporated in the description, wherein each clause by itself can stand as a separate example. Although each dependent clause can refer in the clauses to a specific combination with one of the other clauses, the aspect(s) of that dependent clause are not limited to the specific combination. It will be appreciated that other example clauses can also include a combination of the dependent clause aspect(s) with the subject matter of any other dependent clause or independent clause or a combination of any feature with other dependent and independent clauses. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of a clause can be included in any other independent clause, even if the clause is not directly dependent on the independent clause.

Implementation examples are described in the following numbered clauses:

Clause 1. A semiconductor device comprising: a memory cell, comprising: a plurality of gate structures extending in a first direction and spaced apart from each other in a second direction by one of a first plurality of source/drain (S/D) structures, each gate structure comprising a channel structure and a metal gate structure, the channel structure comprising at least one channel extending in the second direction through the metal gate structure and connecting adjacent S/D structures in the first plurality of S/D structures to each other; a frontside inter-layer dielectric (FS-ILD) layer disposed on the plurality of gate structures and the first plurality of S/D structures; a frontside metal zero (FM0) interconnect layer, disposed on the FS-ILD layer, comprising a plurality of FM0 interconnects extending in the second direction and spaced apart from each other in the first direction; a backside inter-layer dielectric (BS-ILD) layer disposed on the plurality of gate structures and the first plurality of S/D structures; a backside metal zero (BM0) interconnect layer, disposed on the BS-ILD layer, comprising a plurality of BM0 interconnects extending in the second direction and spaced apart from each other in the first direction; a plurality of frontside source/drain contacts (FSDCs), each FSDC electrically connecting one of the plurality of FM0 interconnects to a top surface of at least one of the first plurality of S/D structures; and a plurality of backside source/drain contacts (BSDCs), each BSDC electrically connecting one of the plurality of BM0 interconnects to a bottom surface of at least one of the first plurality of S/D structures, wherein the memory cell comprises a plurality of n-type field effect transistors (NFETs) and a plurality of p-type field effect transistors (PFETs) to form a cross-coupled inverter pair comprising a first inverter and a second inverter, and wherein for each of the first inverter and the second inverter, at least one of VDD or VSS is provided by one of the plurality of FSDCs and the other of VDD or VSS is provided by one of the plurality of BSDCs.

Clause 2. The semiconductor device of clause 1, wherein an output node for the first inverter comprises one of the plurality of FSDCs, and wherein an output node for the second inverter comprises one of the plurality of BSDCs.

Clause 3. The semiconductor device of any of clauses 1 to 2, further comprising at least one frontside gate contact (FSGC) structure electrically connecting one of the plurality of FM0 interconnects to a top surface of at least one of the plurality of gate structures.

Clause 4. The semiconductor device of any of clauses 1 to 3, further comprising at least one backside jumper contact (BSJC) structure electrically connecting one of the plurality of BSDCs to at least one of the plurality of gate structures.

Clause 5. The semiconductor device of any of clauses 1 to 4, wherein each of the first plurality of S/D structures comprises an EPI layer.

Clause 6. The semiconductor device of any of clauses 1 to 5, wherein the metal gate structure comprises a high-K dielectric layer at least partially surrounding a work function metal layer.

Clause 7. The semiconductor device of any of clauses 1 to 6, wherein the channel structure is contained within a first portion of the metal gate structure and not within a second portion of the metal gate structure.

Clause 8. The semiconductor device of clause 7, wherein the second portion of the metal gate structure is separated from the BS-ILD layer by a shallow trench isolation (STI) layer.

Clause 9. A semiconductor device comprising: a memory cell, comprising: a plurality of gate structures extending in a first direction and spaced apart from each other in a second direction by one of a first plurality of source/drain (S/D) structures, each gate structure comprising a channel structure and a metal gate structure, the channel structure comprising at least one channel extending in the second direction through the metal gate structure and connecting adjacent S/D structures in the first plurality of S/D structures to each other; a frontside inter-layer dielectric (FS-ILD) layer disposed on the plurality of gate structures and the first plurality of S/D structures; a frontside metal zero (FM0) interconnect layer, disposed on the FS-ILD layer, comprising a plurality of parallel FM0 interconnects extending in the second direction and spaced apart from each other in the first direction; a backside inter-layer dielectric (BS-ILD) layer disposed on the plurality of gate structures and the first plurality of S/D structures; a backside metal zero (BM0) interconnect layer, disposed on the BS-ILD layer, comprising a plurality of parallel BM0 interconnects extending in the second direction and spaced apart from each other in the first direction; a plurality of frontside source/drain contacts (FSDCs), each FSDC electrically connecting one of the plurality of FM0 interconnects to a top surface of at least one of the first plurality of S/D structures; a plurality of backside source/drain contacts (BSDCs), each BSDC electrically connecting one of the plurality of BM0 interconnects to a bottom surface of at least one of the first plurality of S/D structures; and a plurality of bitlines, wherein at least one of the plurality of bitlines comprises one of the plurality of BM0 interconnects, wherein the memory cell comprises a plurality of n-type field effect transistors (NFETs) and a plurality of p-type field effect transistors (PFETs) to form a cross-coupled inverter pair comprising a first inverter and a second inverter.

Clause 10. The semiconductor device of clause 9, wherein at least one of the plurality of bitlines comprises one of the plurality of FM0 interconnects.

Clause 11. The semiconductor device of any of clauses 9 to 10, further comprising at least one frontside gate contact (FSGC) electrically connecting one of the plurality of FM0 interconnects to a top surface of at least one of the plurality of gate structures.

Clause 12. The semiconductor device of clause 11, wherein VSS is provided by at least one of the plurality of FM0 interconnects and at least one FSDC or FSGC.

Clause 13. The semiconductor device of any of clauses 11 to 12, wherein VDD is provided by at least one of the plurality of FM0 interconnects and at least one FSDC or FSGC.

Clause 14. The semiconductor device of any of clauses 11 to 13, further comprising at least one backside jumper contact (BSJC) electrically connecting one of the plurality of BSDCs to at least one of the plurality of gate structures.

Clause 15. The semiconductor device of clause 14, wherein VDD is provided by one of the plurality of BM0 interconnects and at least one BSDC or BSJC.

Clause 16. The semiconductor device of clause 14, wherein VDD is provided by at least one of the plurality of FM0 interconnects and at least one FSDC or FSGC and wherein VSS is provided by at least one of the plurality of BM0 interconnects and at least one BSDC or BSJC.

Clause 17. The semiconductor device of any of clauses 9 to 16, wherein each of the first plurality of S/D structures comprises an EPI layer.

Clause 18. The semiconductor device of any of clauses 9 to 17, wherein the metal gate structure comprises a high-K dielectric layer at least partially surrounding a work function metal layer.

Clause 19. The semiconductor device of any of clauses 9 to 18, wherein the channel structure is contained within a first portion of the metal gate structure and not within a second portion of the metal gate structure.

Clause 20. The semiconductor device of clause 19, wherein the second portion of the metal gate structure is separated from the BS-ILD layer by a shallow trench isolation (STI) layer.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A semiconductor device comprising:

a memory cell, comprising:

a plurality of gate structures extending in a first direction and spaced apart from each other in a second direction by one of a first plurality of source/drain (S/D) structures, each gate structure comprising a channel structure and a metal gate structure, the channel structure comprising at least one channel extending in the second direction through the metal gate structure and connecting adjacent S/D structures in the first plurality of S/D structures to each other;

a frontside inter-layer dielectric (FS-ILD) layer disposed on the plurality of gate structures and the first plurality of S/D structures;

a frontside metal zero (FM0) interconnect layer, disposed on the FS-ILD layer, comprising a plurality of FM0 interconnects extending in the second direction and spaced apart from each other in the first direction;

a backside inter-layer dielectric (BS-ILD) layer disposed on the plurality of gate structures and the first plurality of S/D structures;

a backside metal zero (BM0) interconnect layer, disposed on the BS-ILD layer, comprising a plurality of BM0 interconnects extending in the second direction and spaced apart from each other in the first direction;

a plurality of frontside source/drain contacts (FSDCs), each FSDC electrically connecting one of the plurality of FM0 interconnects to a top surface of at least one of the first plurality of S/D structures; and a plurality of backside source/drain contacts (BSDCs), each BSDC electrically connecting one of the plurality of BM0 interconnects to a bottom surface of at least one of the first plurality of S/D structures, wherein the memory cell comprises a plurality of n-type field effect transistors (NFETs) and a plurality of p-type field effect transistors (PFETs) to form a cross-coupled inverter pair comprising a first inverter and a second inverter, wherein an output of the first inverter is provided to an input of the second inverter via an electrical path comprising one of the plurality of FSDCs and a frontside jumper contact (FSJC) structure electrically connected to a gate structure of the second inverter, and wherein an output of the second inverter is provided to an input of the first inverter via an electrical path comprising one of the plurality of BSDCs and a backside jumper contact (BSJC) structure electrically connected to a gate structure of the first inverter.

2. The semiconductor device of claim 1, wherein for each of the first inverter and the second inverter, at least one of VDD or VSS is provided by one of the plurality of FSDCs and the other of VDD or VSS is provided by one of the plurality of BSDCs.

3. The semiconductor device of claim 1, further comprising at least one frontside gate contact (FSGC) structure electrically connecting the FSJC structure to a top surface of at least one of the plurality of gate structures.

4. The semiconductor device of claim 1, wherein each of the first plurality of S/D structures comprises an EPI layer.

5. The semiconductor device of claim 1, wherein the metal gate structure comprises a high-K dielectric layer at least partially surrounding a work function metal layer.

6. The semiconductor device of claim 1, wherein the channel structure is contained within a first portion of the metal gate structure and not within a second portion of the metal gate structure.

7. The semiconductor device of claim 6, wherein the second portion of the metal gate structure is separated from the BS-ILD layer by a shallow trench isolation (STI) layer.

8. A semiconductor device comprising:

a memory cell, comprising:

a plurality of gate structures extending in a first direction and spaced apart from each other in a second direction by one of a first plurality of source/drain (S/D) structures, each gate structure comprising a channel structure and a metal gate structure, the channel structure comprising at least one channel extending in the second direction through the metal gate structure and connecting adjacent S/D structures in the first plurality of S/D structures to each other;

a frontside inter-layer dielectric (FS-ILD) layer disposed on the plurality of gate structures and the first plurality of S/D structures;

a frontside metal zero (FM0) interconnect layer, disposed on the FS-ILD layer, comprising a plurality of parallel FM0 interconnects extending in the second direction and spaced apart from each other in the first direction;

a backside inter-layer dielectric (BS-ILD) layer disposed on the plurality of gate structures and the first plurality of S/D structures;

a backside metal zero (BM0) interconnect layer, disposed on the BS-ILD layer, comprising a plurality of parallel BM0 interconnects extending in the second direction and spaced apart from each other in the first direction;

a plurality of frontside source/drain contacts (FSDCs), each FSDC electrically connecting one of the plurality of FM0 interconnects to a top surface of at least one of the first plurality of S/D structures;

a plurality of backside source/drain contacts (BSDCs), each BSDC electrically connecting one of the plurality of BM0 interconnects to a bottom surface of at least one of the first plurality of S/D structures; and a plurality of bitlines, wherein at least one of the plurality of bitlines comprises one of the plurality of BM0 interconnects, wherein the memory cell comprises a plurality of n-type field effect transistors (NFETs) and a plurality of p-type field effect transistors (PFETs) to form a cross-coupled inverter pair comprising a first inverter and a second inverter, wherein an output of the first inverter is provided to an input of the second inverter via an electrical path comprising one of the plurality of FSDCs and a frontside jumper contact (FSJC) structure electrically connected to a gate structure of the second inverter, and wherein an output of the second inverter is provided to an input of the first inverter via an electrical path comprising one of the plurality of BSDCs and a backside jumper contact (BSJC) structure electrically connected to a gate structure of the first inverter.

9. The semiconductor device of claim 8, wherein at least one of the plurality of bitlines comprises one of the plurality of FM0 interconnects.

10. The semiconductor device of claim 8, further comprising at least one frontside gate contact (FSGC) electrically connecting the FSJC structure to a top surface of at least one of the plurality of gate structures.

11. The semiconductor device of claim 10, wherein VSS is provided by at least one of the plurality of FM0 interconnects and at least one FSDC or FSGC.

12. The semiconductor device of claim 10, wherein VDD is provided by at least one of the plurality of FM0 interconnects and at least one FSDC or FSGC.

13. The semiconductor device of claim 8, wherein VDD is provided by one of the plurality of BM0 interconnects and at least one BSDC or BSJC.

14. The semiconductor device of claim 8, wherein VDD is provided by at least one of the plurality of FM0 interconnects and at least one FSDC or FSGC and wherein VSS is provided by at least one of the plurality of BM0 interconnects and at least one BSDC or BSJC.

15. The semiconductor device of claim 8, wherein each of the first plurality of S/D structures comprises an EPI layer.

16. The semiconductor device of claim 8, wherein the metal gate structure comprises a high-K dielectric layer at least partially surrounding a work function metal layer.

17. The semiconductor device of claim 8, wherein the channel structure is contained within a first portion of the metal gate structure and not within a second portion of the metal gate structure.

18. The semiconductor device of claim 17, wherein the second portion of the metal gate structure is separated from the BS-ILD layer by a shallow trench isolation (STI) layer.

* * * * *